United States Patent [19]
Crawford

[11] Patent Number: 5,593,123
[45] Date of Patent: Jan. 14, 1997

[54] VACUUM SYSTEM COMPONENTS

[75] Inventor: Charles K. Crawford, Wilton, N.H.

[73] Assignee: Kimball Physics, Inc., Wilton, N.H.

[21] Appl. No.: 399,906

[22] Filed: Mar. 7, 1995

[51] Int. Cl.6 ................................................. F21L 15/08
[52] U.S. Cl. ................. 248/231.21; 248/225.11; 248/226.11; 248/220.21
[58] Field of Search ................... 248/231.21, 226.11, 248/231.9, 225.11, 220.21, 363; 445/28, 29; 250/440.11, 441.11

[56] References Cited

U.S. PATENT DOCUMENTS

| | | | |
|---|---|---|---|
| 3,015,177 | 1/1962 | Hembd et al. | 248/231.21 X |
| 3,015,897 | 1/1962 | Hopp | 248/231.21 X |
| 3,189,187 | 6/1965 | Guyer, Jr. et al. | 248/231.21 X |
| 3,208,758 | 9/1965 | Carlson et al. | 277/171 |
| 4,145,840 | 3/1979 | Davidson | 248/231.21 X |
| 4,681,329 | 7/1987 | Contin | 277/167.5 |
| 4,718,637 | 1/1988 | Contin | 251/158 |
| 5,116,023 | 5/1992 | Contin | 251/203 |

OTHER PUBLICATIONS

MDC Vacuum Products Corp., Product catalog, pp. 2, 326–329 1992.
Kimball Physics, Inc., Product catalog, pp. 1–2, & 5:1–5:14, 1994.

*Primary Examiner*—Ramon O. Ramirez
*Assistant Examiner*—Michael J. Turgeon
*Attorney, Agent, or Firm*—Hayes, Soloway, Hennessey, Grossman & Hage, P.C.

[57] ABSTRACT

A mounting system for attaching internal apparatus within a vacuum system comprises a mounting assembly for engaging the side wall surfaced of circumferential grooves formed in the internal wall surface of a vacuum joint flange. The mounting assembly comprises an arcuate shaped metal piece having a slit or saw kerf formed in its outer circumferential surface and defining a pair of arcuate shaped engagement webs, each of which is dimensioned to engage the circumferential grooves formed in the inner side wall surface of the flange. A set screw urges the webs into engagement with the side walls defining the grooves.

6 Claims, 7 Drawing Sheets

VACUUM SYSTEM COMPONENTS

FIELD OF THE INVENTION

This invention relates to vacuum systems, and more particularly to a mounting system for attaching internal apparatus such as electron gun parts, target holders, etc. within a high vacuum or ultra-high vacuum system.

BACKGROUND OF THE INVENTION

Vacuum systems find wide application in research, education, product development and production. By way of example, a vacuum system may include, amongst other components, an electron gun aimed at a specimen target. The specimen target typically is carried on a holder which is mounted internally of the vacuum system.

Figure 1:
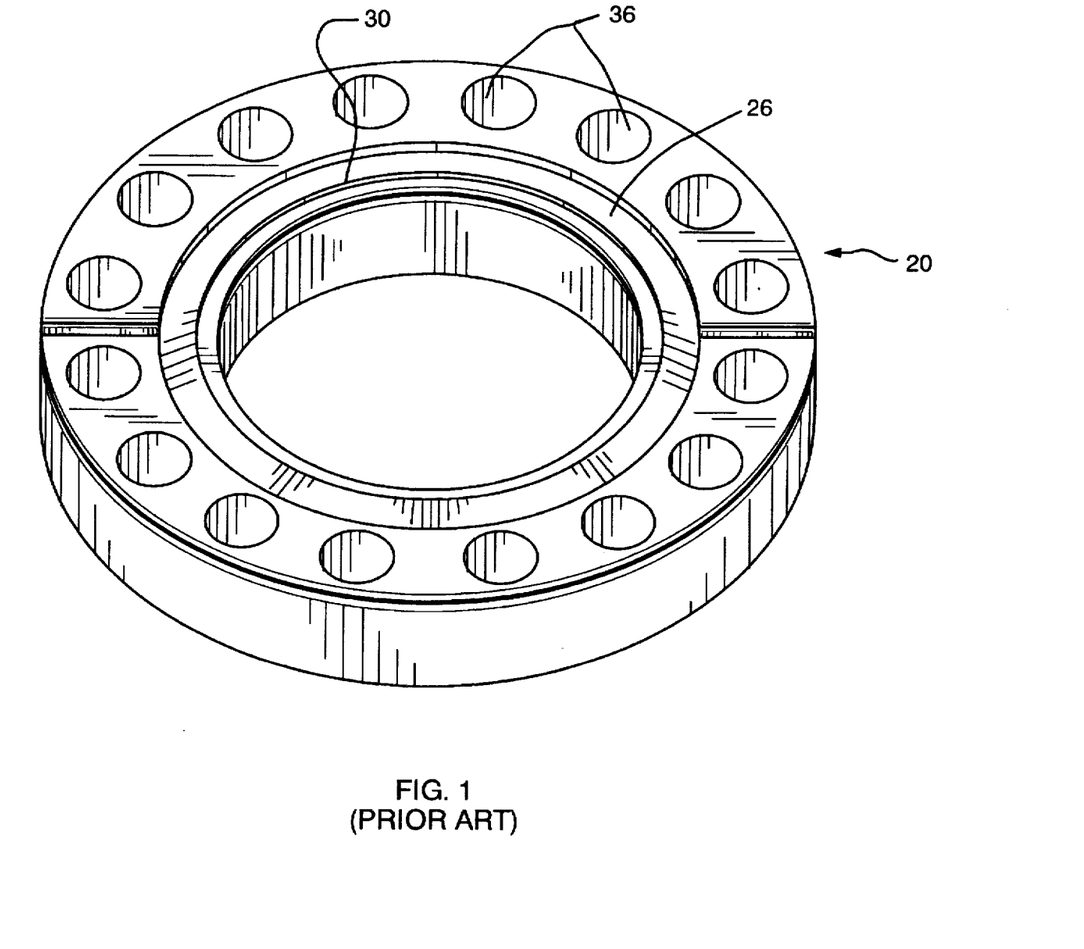
FIG. 1 a perspective view of a prior art vacuum flange for forming an all-metal vacuum joint.
Figure 2:
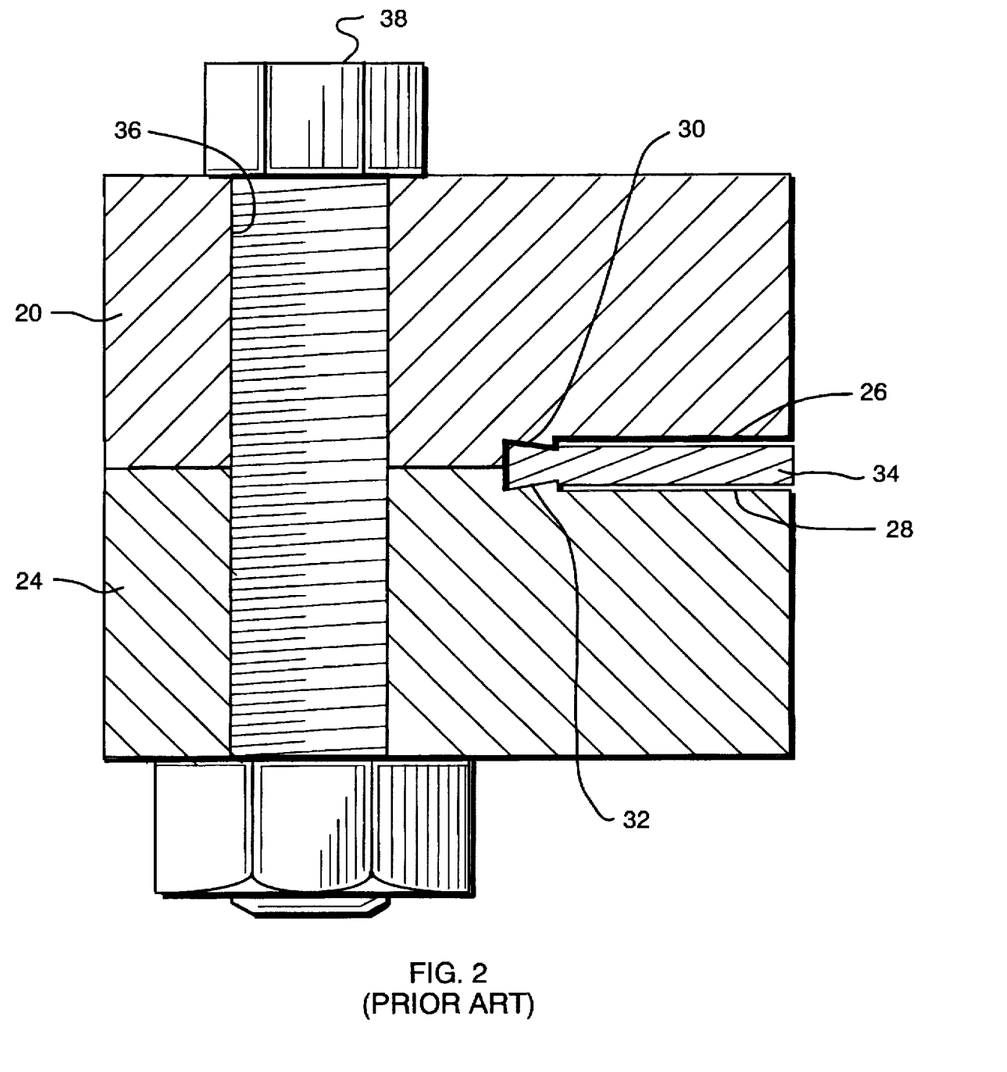
FIG. 2 is an enlarged cross-sectional view of an all-metal vacuum joint in accordance with the prior art.

Typical UHV vacuum systems employ components having all-metal vacuum joints. Referring to FIGS. 1 and 2, a typical all-metal vacuum joint comprises a metal flange member 20 for mating with a like flange member 24. Flange members 20 and 24 each include an annular recess 26, 28, each having an annular "knife edge" 30, 32 for accommodating and engaging a soft metal gasket 34, e.g. in accordance with the teachings of U.S. Pat. 3,208,758.

Flanged members 20 and 24 have a plurality of circumferentially arranged holes 36 for accommodating a plurality of threaded bolts 38 which provide a force to draw flange members 20 and 24 together capturing and engaging the sealing gasket 34.

Various mounting systems are available commercially for positioning and holding internal apparatus within the vacuum system. The present invention provides an improvement in mounting systems for attaching internal apparatus within a vacuum system from the vacuum joint.

In accordance with the present invention, there is provided a system for attaching internal apparatus within a vacuum system comprising a mounting assembly for engaging side wall surfaces of circumferential grooves formed in the inner wall surface of a vacuum joint. The mounting assembly comprises an arcuate shaped metal piece having a slit or saw kerf formed in its outer circumferential surface and defining a pair of arcuate shaped engagement webs, each of which is dimensioned to engage the circumferential grooves formed in the inner side wall surface of the flange. Means are provided for urging the webs in engagement with the walls defining the grooves.

BRIEF DESCRIPTION OF THE DRAWINGS

Still other features and advantages of the present invention will become apparent from the following detailed description taken in connection with the accompanying drawings wherein.

DETAILED DESCRIPTION OF THE PREFERRED EMBODIMENT

Figure 3:
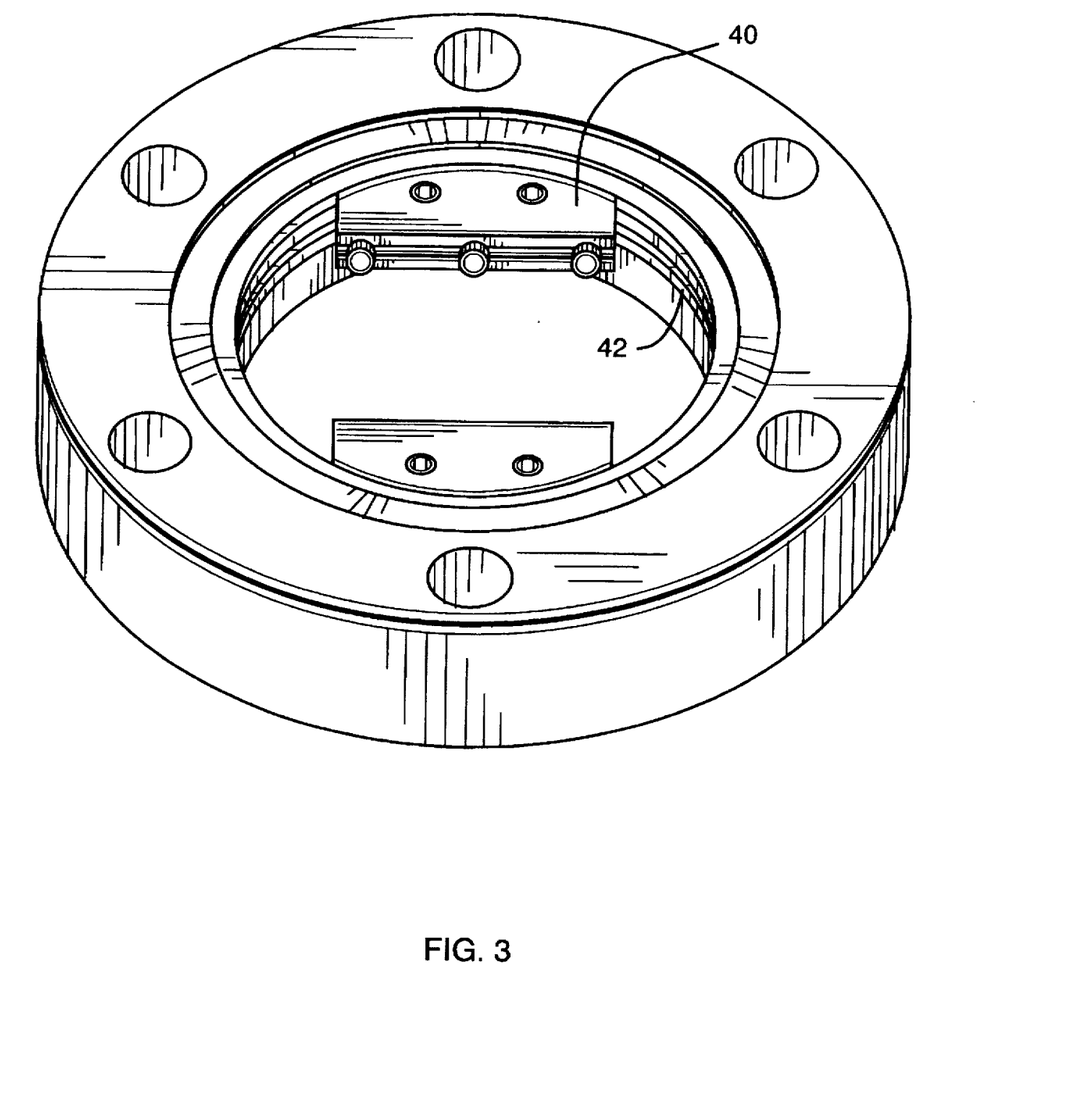
FIG. 3 is a perspective view of an improved system made in accordance with the present invention.
Figure 4:
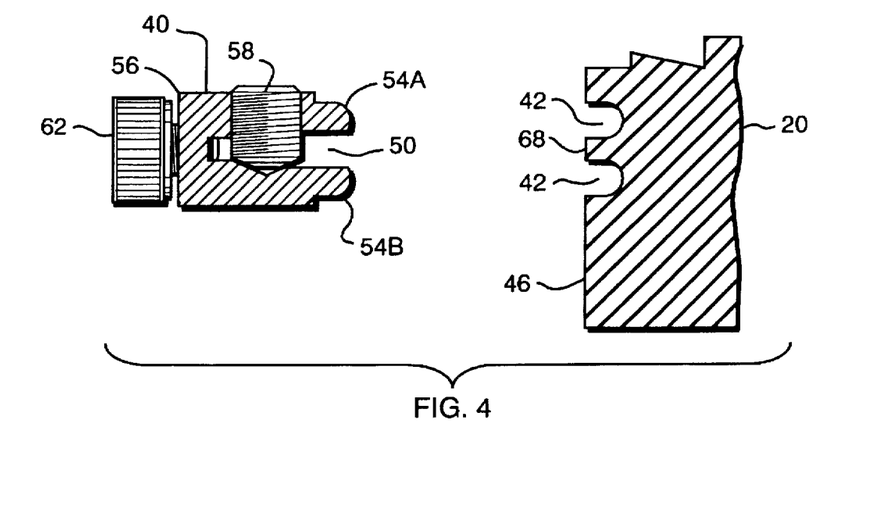
FIG. 4 is an exploded cross-sectional view of a portion of the system of FIG. 3.
Figure 5:
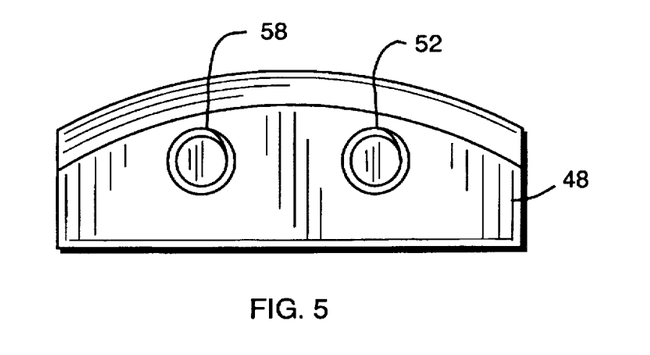
FIG. 5 is a top plan view of She mounting assembly portion of a system in accordance with the present invention.
Figure 6:
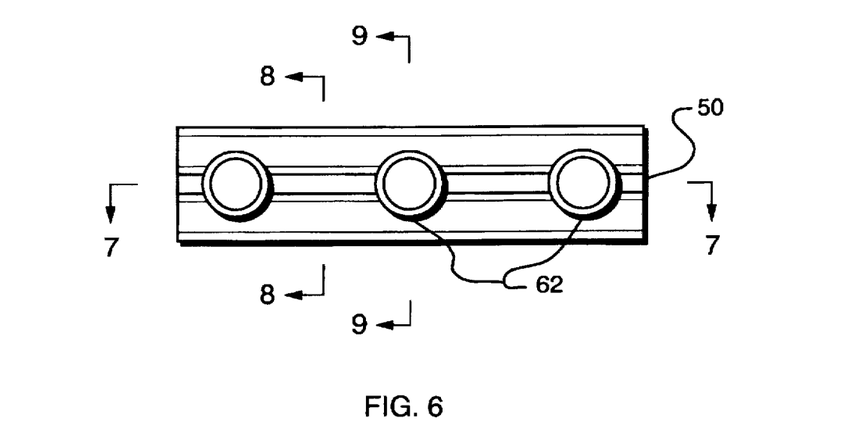
FIG. 6 is a side elevational view of the mounting assembly of FIG. 5.
Figure 7:
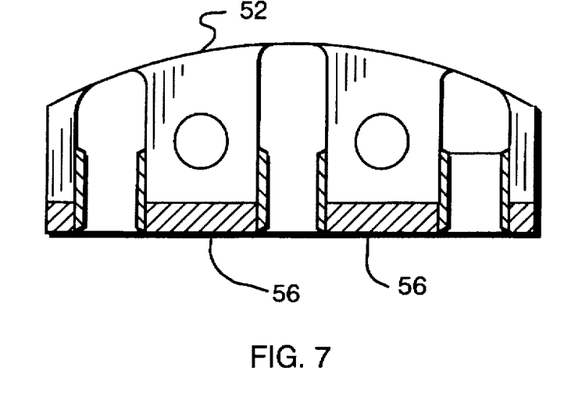
FIG. 7 is a sectional view of the mounting assembly of FIG. 6 taken along section A—A.
Figure 8:
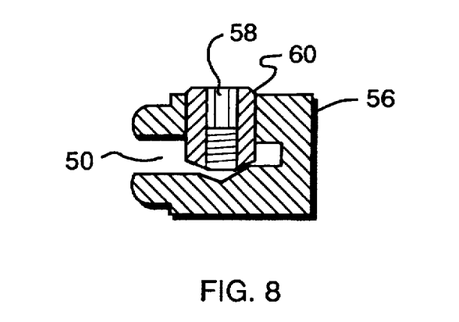
FIG. 8 is a view similar to FIG. 7, taken along section B—B.
Figure 9:
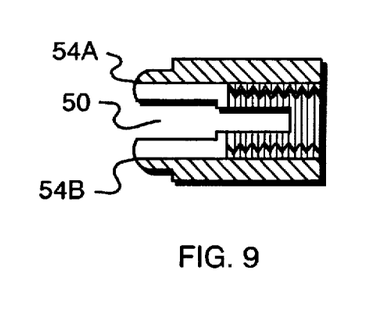
FIG. 9 is a view similar to FIG. 7, taken along section C—C.

Referring now to FIGS. 3 and 4, the system in accordance with the present invention comprises a mounting assembly 40 for engaging side wall surfaces of circumferential grooves 42 formed in the inner side wall surface 46 of the flange 20.

Referring also to FIGS. 5–9, the mounting assembly 40 comprises a curved metallic body 48 having a slit or saw kerf 50 formed in its outer circumferential surface 52 whereby to provide a pair of elongate curved fingers or webs 54A, 54B joined at a backbone 56. The outer surface 52 is dimensioned to engage and mate with of grooves 42.

Means such as set screws 58 are driven into threaded holes 60 in web 54A so that when the mounting assembly 40 is positioned in grooves 42, the webs 54A and 54B may be driven apart so as to frictionally engage and grab the walls defining grooves 42, and secure the mounting assembly 40 in place. Thereafter, internal apparatus maybe affixed to the mounting assembly, e.g. by bolting into threaded holes 62 provided in backbone 56.

The mounting assemblies made in accordance with the present invention may be in varied in size to accommodate various loads. For example, for light loads, one or a pair of short segments may be employed. For heavier loads, longer segments may be employed.

Because of the axial symmetry of the grooves, the mounting assemblies of the present invention may be mounted in any annular orientation about the grooves.

Figure 10:
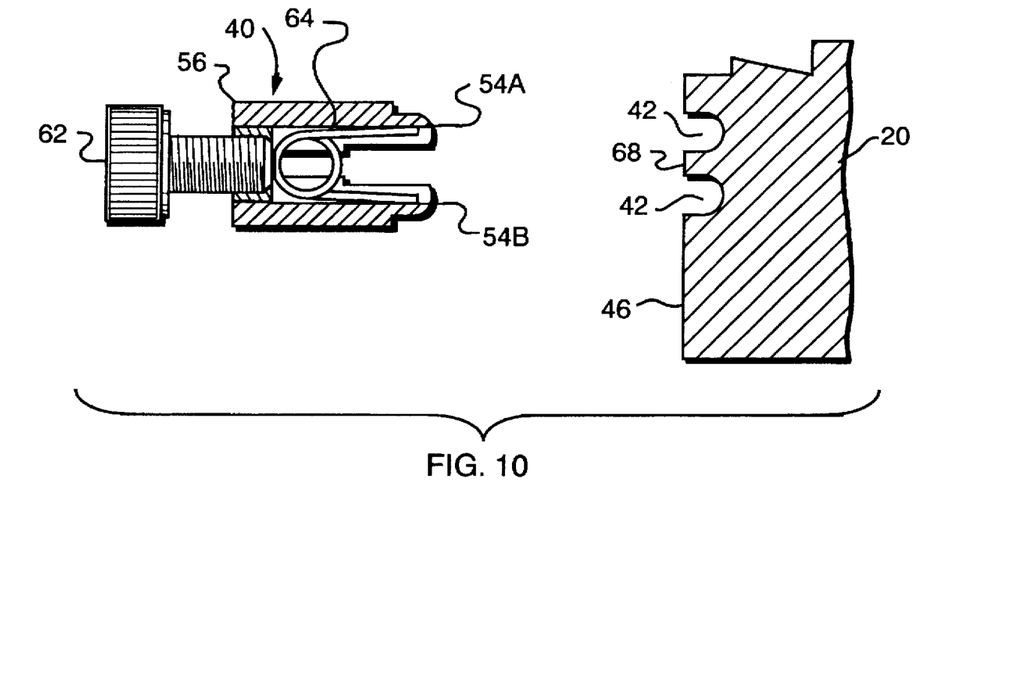
FIG. 10 is a cross sectional view of another embodiment of the mounting assembly made in accordance with the present invention.
Figure 11:
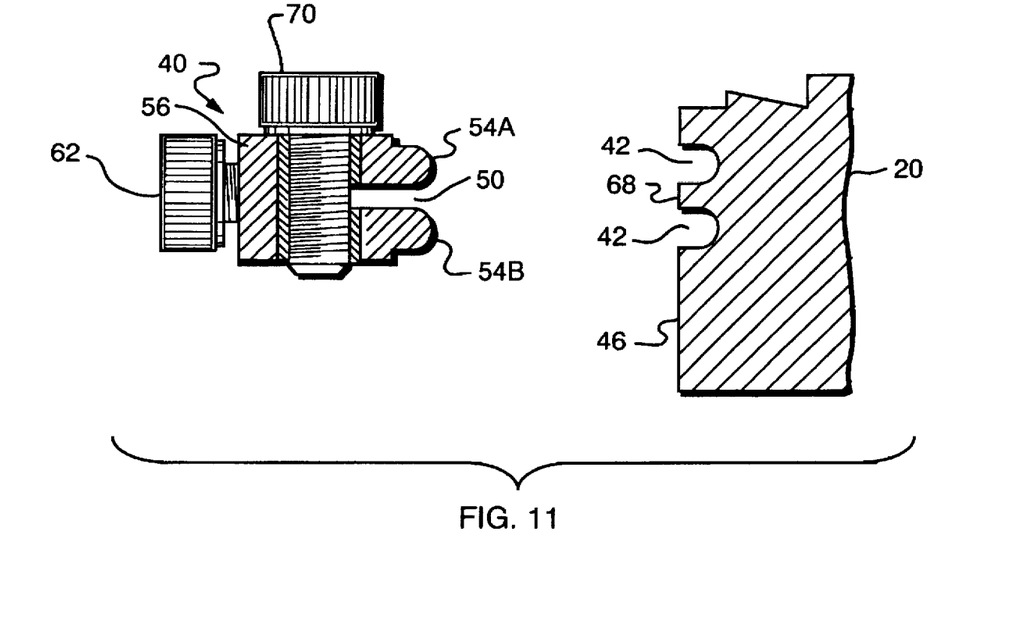
FIG. 11 is a view similar to FIG. 10 of yet another embodiment of clamping assembly made in accordance with the present invention.
Figure 12A:
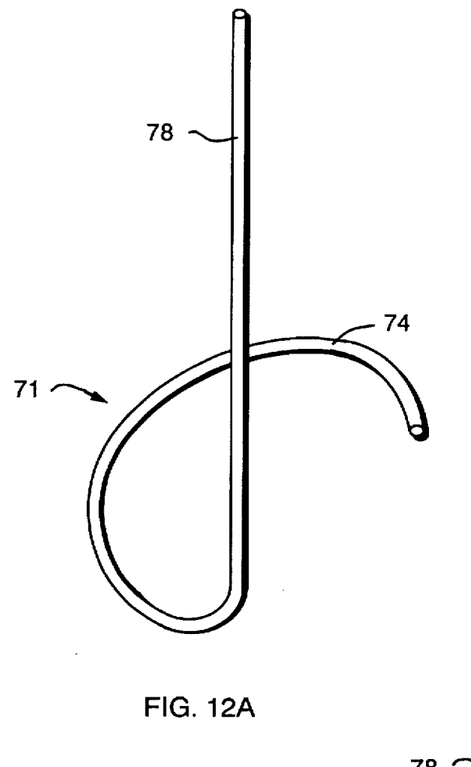
FIGS. 12A and 12B are perspective views showing two alternative mounting assemblies made in accordance with the present invention.
Figure 12B:
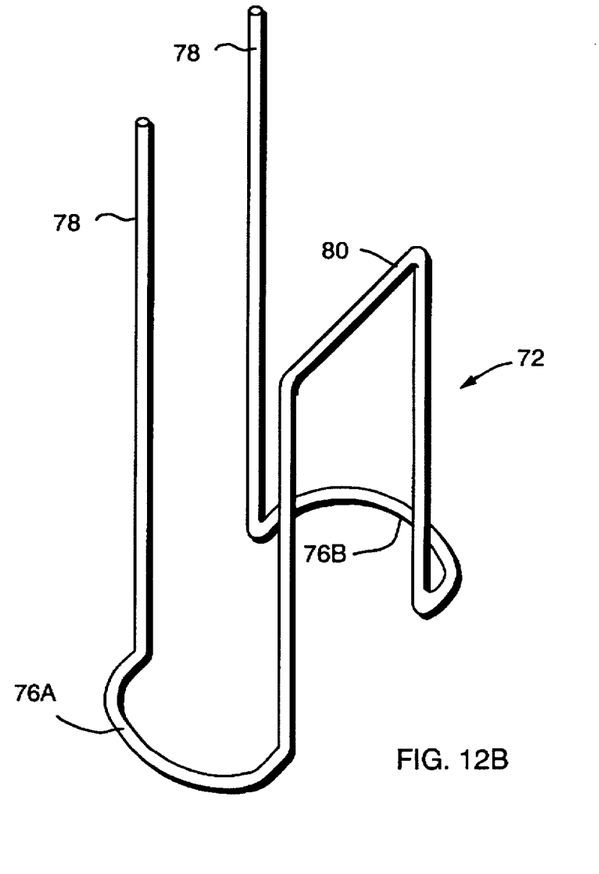

Various changes may be made in the above construction without departing from the scope of the invention. For example, referring to FIG. 10, it is possible to employ spring means 64 for exerting a spreading force on webs 54A and 54B. In such case one needs to pinch the webs together to install the mounting assembly on the joint grooves 42. Alternatively, as shown in FIG. 11, screws 70 may be threaded into and capture only lower web 54B so that when the screws are tightened the spacing between webs 54A and 54B is reduced whereby to provide to clamping action on the annular ring 68 which separates and defines grooves 42, in part. Referring to FIGS. 12A and 12B, the mounting assembly also may comprise a one-piece wire spring member. 71, 72 having at least one semi-circular shaped portion 74, 76A and 76B, for engaging the circumferential grooves in the inner wall surface of the vacuum joint. One or several legs 78, 80 are provided extending preferably generally perpendicularly to the semi-circular shaped portion 74, 76A and 76B to which internal apparatus may be affixed, e.g. by spot welding. Also, while the preferred embodiment describes providing a pair of grooves in the inner wall surface of the vacuum joint, a single groove or three or more grooves advantageously may be employed. Thus, as used herein the term "grooves" is meant to mean at least one groove.

It is therefore intended that all matter contained in the above description or shown in the accompanying drawings shall be interpreted as illustrative and not in a limiting sense.

I claim:

1. A system for attaching an internal apparatus within a vacuum device, said system having a vacuum joint comprising a pair of substantially parallel flanged members, at least one of said flanged members having at least one groove formed in an inner surface, and further comprising a substantially U-shaped mounting assembly which has a pair of substantially parallel webs, each of said webs having a distal end engaging at least one said groove and a means for urging said webs to engage side wall surfaces of said groove.

2. A system according to claim 1, wherein said mounting assembly comprises a one-piece body comprising a pair of webs joined together at a backbone, said webs having an arcuate-shaped surface which is dimensioned to engage said circumferential groove.

3. A system according to claim 2, wherein said means for urging comprises screw means.

4. A system according to claim 2, wherein said means for urging comprises spring means.

5. A system according to claim 2, and further comprising one or more bores formed in the backbone for accommodating fixturing means.

6. A system according to claim 5, wherein said bores comprise threaded bores.

* * * * *

UNITED STATES PATENT AND TRADEMARK OFFICE
CERTIFICATE OF CORRECTION

PATENT : 5,593,123

DATED : January 14, 1997

INVENTOR(S) : Charles K. Crawford

It is certified that error appears in the above-identified patent and that said Letters Patent is hereby corrected as shown below:

The title page, showing the illustrative figure, should be deleted, and substitute therefor the attached title page.

Drawing figures 2, 3, 4, 6, 7, 8, 9, 10, and 11, should be deleted, and substitute therefor figures 2, 3, 4, 6, 7, 8, 9, 10, and 11, as shown on the attached pages.

Signed and Sealed this

Twentieth Day of May, 1997

*Attest:*

BRUCE LEHMAN

*Attesting Officer*     *Commissioner of Patents and Trademarks*

United States Patent [19]

Crawford

[11] Patent Number: 5,593,123
[45] Date of Patent: Jan. 14, 1997

[54] VACUUM SYSTEM COMPONENTS

[75] Inventor: Charles K. Crawford, Wilton, N.H.

[73] Assignee: Kimball Physics, Inc., Wilton, N.H.

[21] Appl. No.: 399,906

[22] Filed: Mar. 7, 1995

[51] Int. Cl.[6] ....................................... F21L 15/08
[52] U.S. Cl. ............................ 248/231.21; 248/225.11; 248/226.11; 248/220.21
[58] Field of Search .................... 248/231.21, 226.11, 248/231.9, 225.11, 220.21, 363; 445/28, 29; 250/440.11, 441.11

[56] References Cited

U.S. PATENT DOCUMENTS

| | | | |
|---|---|---|---|
| 3,015,177 | 1/1962 | Hembd et al. | 248/231.21 X |
| 3,015,897 | 1/1962 | Hopp | 248/231.21 X |
| 3,189,187 | 6/1965 | Guyer, Jr. et al. | 248/231.21 X |
| 3,208,758 | 9/1965 | Carlson et al. | 277/171 |
| 4,145,840 | 3/1979 | Davidson | 248/231.21 X |
| 4,681,329 | 7/1987 | Contin | 277/167.5 |
| 4,718,637 | 1/1988 | Contin | 251/158 |
| 5,116,023 | 5/1992 | Contin | 251/203 |

OTHER PUBLICATIONS

MDC Vacuum Products Corp., Product catalog, pp. 2, 326–329 1992.
Kimball Physics, Inc., Product catalog, pp. 1–2, & 5:1–5:14, 1994.

*Primary Examiner*—Ramon O. Ramirez
*Assistant Examiner*—Michael J. Turgeon
*Attorney, Agent, or Firm*—Hayes, Soloway, Hennessey, Grossman & Hage, P.C.

[57] ABSTRACT

A mounting system for attaching internal apparatus within a vacuum system comprises a mounting assembly for engaging the side wall surfaced of circumferential grooves formed in the internal wall surface of a vacuum joint flange. The mounting assembly comprises an arcuate shaped metal piece having a slit or saw kerf formed in its outer circumferential surface and defining a pair of arcuate shaped engagement webs, each of which is dimensioned to engage the circumferential grooves formed in the inner side wall surface of the flange. A set screw urges the webs into engagement with the side walls defining the grooves.

6 Claims, 7 Drawing Sheets